(12) United States Patent
Fujita et al.

(10) Patent No.: US 11,766,726 B2
(45) Date of Patent: Sep. 26, 2023

(54) METHOD FOR MACHINING SPUTTERING TARGET, APPARATUS FOR MACHINING SPUTTERING TARGET, SPUTTERING TARGET, AND METHOD FOR PRODUCING SPUTTERING TARGET PRODUCT

(71) Applicant: SUMITOMO CHEMICAL COMPANY, LIMITED, Tokyo (JP)

(72) Inventors: Masahiro Fujita, Niihama (JP); Koji Nishioka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 506 days.

(21) Appl. No.: 16/484,242

(22) PCT Filed: Feb. 9, 2018

(86) PCT No.: PCT/JP2018/004579
§ 371 (c)(1),
(2) Date: Aug. 7, 2019

(87) PCT Pub. No.: WO2018/151037
PCT Pub. Date: Aug. 23, 2018

(65) Prior Publication Data
US 2019/0351491 A1    Nov. 21, 2019

(30) Foreign Application Priority Data
Feb. 16, 2017   (JP) .................. 2017-027098

(51) Int. Cl.
*H01J 37/34*   (2006.01)
*B23C 3/12*   (2006.01)
*C23C 14/34*   (2006.01)

(52) U.S. Cl.
CPC ............ *B23C 3/12* (2013.01); *C23C 14/3407* (2013.01)

(58) Field of Classification Search
CPC .............. C23C 14/3407; H01J 37/3423; H01J 37/3491; B23Q 3/088; B23Q 3/08;
(Continued)

(56) References Cited

U.S. PATENT DOCUMENTS 6,093,293 A * 7/2000 Haag ....................... C23C 14/35
204/298.18

FOREIGN PATENT DOCUMENTS

CN    102652182 A    8/2012
EP    1116800    *    7/2001
(Continued)

OTHER PUBLICATIONS

Machine Translation Sakai et al. (JP 2011-132557) (Year: 2011).*
(Continued)

*Primary Examiner* — Rodney G McDonald
(74) *Attorney, Agent, or Firm* — Birch, Stewart, Kolasch & Birch, LLP

(57) ABSTRACT

A method for machining a sputtering target that includes a sputtering surface, an opposing surface opposite to the sputtering surface, and an outer peripheral surface being between the sputtering surface and the opposing surface comprises the steps of: fixing the sputtering target on a fixing table by mounting the sputtering surface or the opposing surface of the sputtering target on the fixing table; and cutting the outer peripheral surface of the sputtering target (Continued)

by a cutting tool while rotating the cutting tool along a circumferential direction of the outer peripheral surface of the sputtering target.

5 Claims, 6 Drawing Sheets

(58) Field of Classification Search
CPC .... B23C 3/12; B23C 3/13; B23C 3/00; B23C 2222/04
USPC ........................................ 204/298.12, 298.13
See application file for complete search history.

(56) References Cited

FOREIGN PATENT DOCUMENTS

| JP | 63-199808 | * | 8/1988 |
| JP | S63-200955 | A | 8/1988 |
| JP | H05-84682 | A | 4/1993 |
| JP | H11-254231 | A | 9/1999 |
| JP | 2004-017274 | A | 1/2004 |
| JP | 2008-034766 | A | 2/2008 |
| JP | 2008-119758 | A | 5/2008 |
| JP | 2009-127125 | A | 6/2009 |
| JP | 2011-132557 | A | 7/2011 |
| JP | 2014-205205 | A | 10/2014 |
| JP | 2016-201458 | A | 12/2016 |

OTHER PUBLICATIONS

Machine Translation JP 63-199808 (Year: 1988).*
Chinese First Office Action (including an English translation thereof) issued in the corresponding Chinese Patent Application No. 201880010776.8 dated Dec. 25, 2020.
International Search Report for PCT/JP2018/004579 (PCT/ISA/210) dated Apr. 17, 2018, with English translation.
Japanese Decision of Refusal (including an English translation thereof) for corresponding Japanese Patent Application No. 2018-016407, dated Dec. 7, 2018.
Japanese Decision to Grant a Patent (including an English translation thereof) for corresponding Japanese Patent Application No. 2018-016407, dated Apr. 17, 2019.
Japanese Notice of Reasons of Refusal (including an English translation thereof) for corresponding Japanese Patent Application No. 2018-016407, dated Apr. 19, 2018.
Japanese Notice of Reasons of Refusal (including an English translation thereof) for corresponding Japanese Patent Application No. 2018-016407, dated Aug. 10, 2018.
Japanese Notice of Reasons of Refusal (including an English translation thereof) for corresponding Japanese Patent Application No. 2019-033882, dated Jul. 4, 2019.

* cited by examiner

METHOD FOR MACHINING SPUTTERING TARGET, APPARATUS FOR MACHINING SPUTTERING TARGET, SPUTTERING TARGET, AND METHOD FOR PRODUCING SPUTTERING TARGET PRODUCT

TECHNICAL FIELD

The present invention relates to a method for machining a sputtering target, an apparatus for machining a sputtering target, a sputtering target, and a method for producing a sputtering target product.

BACKGROUND ART

The production of sputtering target products conventionally includes a step of machining each side of the outer peripheral surface of a sputtering target, with the sides thereof constituting the outer peripheral surface, by cutting the outer peripheral surface of the sputtering target with a cutting tool (for example, see Patent Document 1).

PRIOR ART DOCUMENT

Patent Document

Patent Document 1: JP 1993-84682 A

DISCLOSURE OF THE INVENTION

Problems to be Solved by the Invention

Sputtering target products are required to have no distortion on the outer peripheral surfaces of sputtering targets. Abnormal electrical discharge may be induced when a high voltage is applied between a substrate and the sputtering target with some distortion on the outer surface of the sputtering target.

The present invention provides a method for machining a sputtering target, which can produce a sputtering target with smaller distortion, an apparatus for machining a sputtering target, which can produce a sputtering target with smaller distortion, a sputtering target with smaller distortion, and a method for producing a sputtering target product with smaller distortion.

Means for Solving the Problems

A method for machining a sputtering target that includes a sputtering surface, an opposing surface opposite to the sputtering surface, and an outer peripheral surface being between the sputtering surface and the opposing surface, comprises the steps of:
fixing the sputtering target on a fixing table by mounting the sputtering surface or the opposing surface of the sputtering target on the fixing table; and
cutting the outer peripheral surface of the sputtering target with a cutting tool while rotating the cutting tool along a circumferential direction of the outer peripheral surface of the sputtering target.

According to the method for machining a sputtering target, the outer peripheral surface of the sputtering target is cut with the cutting tool while rotating the cutting tool along the circumferential direction of the outer peripheral surface of the sputtering target. Thus, the outer peripheral surface of the sputtering target can be cut while releasing heat generated at the outer peripheral surface of the sputtering target. Therefore, the distortion that would otherwise occur in the sputtering target due to the heat generated during the machining is reduced, and consequently the sputtering target with smaller distortion can be achieved.

In one embodiment of the method for machining a sputtering target, the fixing table fixes the sputtering target by holding the sputtering surface or the opposing surface of the sputtering target onto the fixing table by vacuum suction.

According to the embodiment, the fixing table fixes the sputtering target by holding the sputtering surface or the opposing surface of the sputtering target onto the fixing table by vacuum suction. Thus, the fixing table can secure a track of the cutting tool without interfering with the movement of the cutting tool when the cutting tool moves along the circumferential direction of the outer peripheral surface of the sputtering target.

An apparatus for machining a sputtering target that includes a sputtering surface, an opposing surface opposite to the sputtering surface, and an outer peripheral surface being between the sputtering surface and the opposing surface comprises:
a fixing table configured to fix the sputtering target by mounting the sputtering surface or the opposing surface of the sputtering target thereon;
a cutting tool configured to cut the sputtering target; and
a controller configured to control the cutting tool such that the outer peripheral surface of the sputtering target is cut by the cutting tool while rotating the cutting tool along a circumferential direction of the outer peripheral surface of the sputtering target.

The controller controls the cutting tool such that the outer peripheral surface of the sputtering target is cut with the cutting tool while rotating the cutting tool along the circumferential direction of the outer peripheral surface of the sputtering target. Thus, the outer peripheral surface of the sputtering target can be cut while releasing heat generated at the outer peripheral surface of the sputtering target. Therefore, the distortion that would otherwise occur in the sputtering target due to the heat generated during the machining is reduced, so that the sputtering target with smaller distortion can be achieved.

A sputtering target comprises:
a sputtering surface, an opposing surface opposite to the sputtering surface, and an outer peripheral surface being between the sputtering surface and the opposing surface, wherein
the outer peripheral surface is substantially rectangular as viewed from a side surface of the sputtering target, and a maximum distortion of the side surface on a long side of the sputtering target is 0.15 mm or smaller.

According to the sputtering target, since the maximum distortion is 0.15 mm or smaller, the high-precision sputtering target can be achieved.

In one embodiment of the sputtering target, a ratio of the maximum distortion of the side surface on the long side of the sputtering target to a length in a long-side direction of the sputtering target is 0.0075% or smaller.

According to the embodiment, since the ratio of the maximum distortion is 0.0075% or smaller, the high-precision sputtering target can be achieved.

In one embodiment of the sputtering target, a length in a long-side direction of the sputtering target is 1,500 mm or larger and 4,000 mm or smaller.

According to the embodiment, the sputtering target with smaller distortion can be produced even though its length in the long-side direction becomes long.

In one embodiment of the sputtering target, an aspect ratio of a length in a long-side direction to a length in a short-side direction of the sputtering target is 5 or larger and 25 or smaller. The aspect ratio is defined as "length in the long-side direction/length in the short-side direction".

According to the embodiment, the sputtering target with smaller distortion can be produced even though it has an elongated shape.

A method for producing a sputtering target product includes a step of machining a sputtering target using the above-mentioned method for machining a sputtering target.

According to the method for producing a sputtering target product, the sputtering target product is produced by the above-mentioned method for machining a sputtering target, thereby making it possible to obtain the sputtering target product with smaller distortion.

Effects of the Invention

According to the method for machining a sputtering target in the present invention, the sputtering target with smaller distortion can be produced.

According to the apparatus for machining a sputtering target in the present invention, the sputtering target with smaller distortion can be produced.

According to the sputtering target of the present invention, the high-precision sputtering target can be produced.

According to the method for producing a sputtering target product in the present invention, the sputtering target product with smaller distortion can be obtained.

MODE FOR CARRYING OUT THE INVENTION

The present invention will be described in detail below with reference to the embodiments shown in the accompanying drawings.

Figure 1:
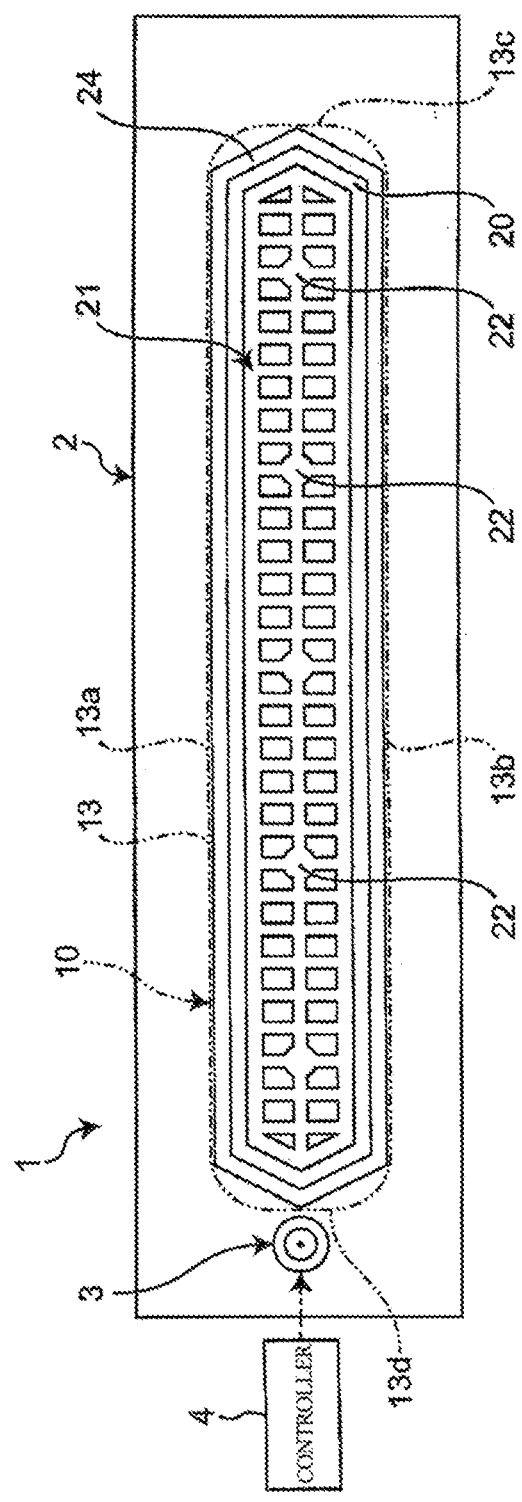
FIG. 1 is a plan view showing one embodiment of an apparatus for machining a sputtering target.
Figure 2:
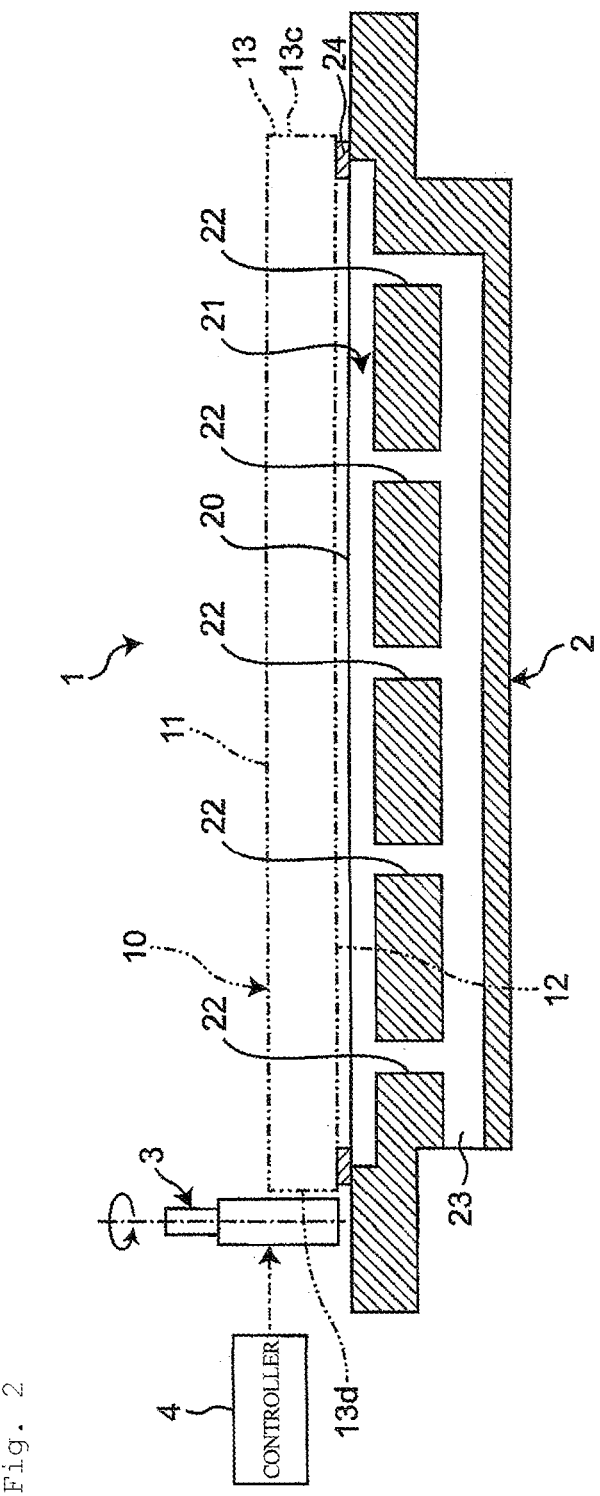
FIG. 2 is a cross-sectional view showing the embodiment of the apparatus for machining a sputtering target.

FIG. 1 is a plan view showing one embodiment of an apparatus for machining a sputtering target. FIG. 2 is a cross-sectional view of the apparatus for machining a sputtering target. As shown in FIGS. 1 and 2, the apparatus for machining a sputtering target (hereinafter referred to as a machining apparatus 1) performs a cutting process on a sputtering target 10. The term "cutting process" as used herein includes cutting, grinding, polishing, and the like.

The sputtering target 10 includes a sputtering surface 11, an opposing surface 12 opposite to the sputtering surface 11, and an outer peripheral surface 13 being between the sputtering surface 11 and the opposing surface 12. The sputtering target 10 is formed in a long plate shape. The outer peripheral surface 13 is substantially rectangular as viewed from the side surface of the plate-shaped sputtering target. The outer peripheral surface 13 includes a first side surface 13a and a second side surface 13b located on the long side and facing each other, and a third side surface 13c and a fourth side surface 13d located on the short side and facing each other.

During the sputtering, inert gas ionized by the sputtering collides with the sputtering surface 11 of the sputtering target 10. Target atoms contained in the sputtering target 10 are sputtered and ejected from the sputtering surface 11 with which the ionized inert gas collides. The sputtered atoms are deposited on a substrate disposed facing the sputtering surface 11 to thereby form a thin film on the substrate.

The sputtering target 10 can be made of a material selected from the group consisting of metals, such as aluminum (Al), copper (Cu), chromium (Cr), iron (Fe), tantalum (Ta), titanium (Ti), zirconium (Zr), tungsten (W), molybdenum (Mo), niobium (Nb), and indium (In), and alloys thereof.

However, the material of the sputtering target 10 is not limited thereto. Al is preferable as the material of the sputtering target 10 for an electrode or wiring material. The purity of Al is preferably 99.99% or larger, and more preferably 99.999% or larger. The high-purity Al is suitable as a raw material of a target material 1 for an electrode or wiring material because of its high electrical conductivity. The higher the purity of Al is, the softer and more deformable the Al material is. For this reason, the method for machining the sputtering target of the present invention can be suitably used for the production of the target material using the high-purity Al as the raw material.

The machining apparatus 1 includes a fixing table 2 for fixing the sputtering target 10, a cutting tool 3 for cutting the sputtering target 10, and a controller 4 for controlling the cutting tool 3.

The fixing table 2 fixes the sputtering target 10 and mount the opposing surface 12 of the sputtering target 10 on the fixing table. Specifically, the fixing table 2 includes a mounting surface 20 where the sputtering target 10 is mounted. The mounting surface 20 is provided with grid pattern intake groove 21. A plurality of intake hole 22 is provided at the bottom surface of the intake groove 21. The plurality of intake hole 22 communicates with an intake passage 23. The intake passage 23 is connected to a vacuum apparatus (not shown). An annular seal member 24 is provided on the mounting surface 20 so as to surround the intake groove 21.

Thus, when the vacuum apparatus is actuated with the sputtering target 10 mounted on the seal member 24, the opposing surface 12 of the sputtering target 10 is held onto the seal member 24 by vacuum suction through the intake groove 21, the intake hole 22, and the intake passage 23.

The cutting tool 3 is a cutter, such as an end mill, a radian cutter, or an R cutter. The cutting tool 3 can cut the sputtering target 10 by getting contact with the sputtering target 10 while rotating about its axis (or rotating on its axis).

The controller 4 controls the operation of the cutting tool 3. Specifically, the controller 4 controls the cutting tool 3 such that the outer peripheral surface 13 of the sputtering target 10 is cut with the cutting tool 3 while rotating (revolving) the cutting tool 3 along the circumferential direction of the outer peripheral surface 13 of the sputtering target 10.

The controller 4 can change the rotation speed and the revolution speed of the sputtering target 10.

Types of the machining apparatus 1 include a milling machine, an NC milling machine, a machining center, and the like.

A method for machining a sputtering target 10 will be described below.

The opposing surface 12 of the sputtering target 10 is mounted on the fixing table 2 to fix the sputtering target 10 on the fixing table 2. At this time, for example, the opposing surface 12 of the sputtering target 10 is held onto the fixing table by vacuum suction to thereby fix the sputtering target 10.

Figure 3:
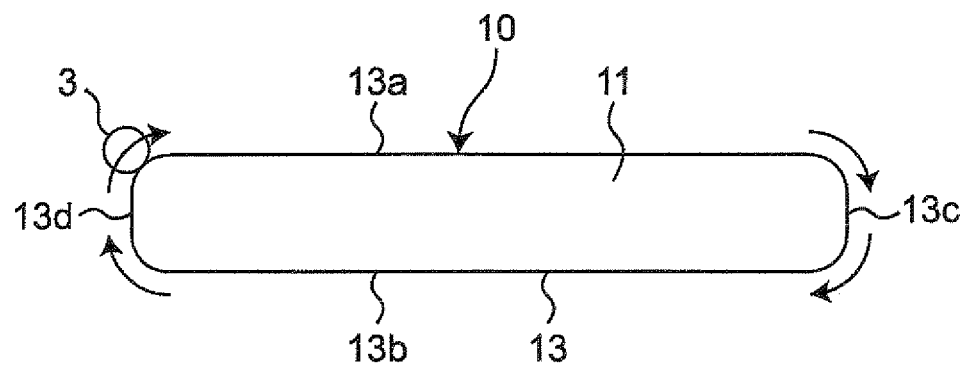
FIG. 3 is a plan view showing one embodiment of a method for machining a sputtering target.
Figure 4:
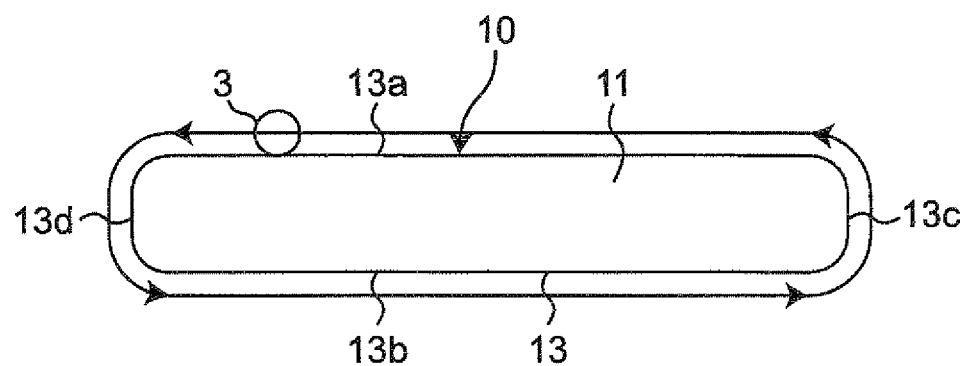
FIG. 4 is a plan view showing one embodiment of a method for machining a sputtering target.

Subsequently, as shown in FIG. 3, the cutting tool 3 is moved along the direction indicated by the arrows, so that the outer peripheral surface 13, for example, each corner of the outer peripheral surface 13, is cut with the cutting tool 3. Then, as shown in FIG. 4, the cutting tool 3, which is concurrently rotating on its axis, is rotated (to orbit the sputtering target) along the circumferential direction (direction indicated by the arrows) of the outer peripheral surface 13 of the sputtering target 10, thereby cutting the outer peripheral surface 13 of the sputtering target 10.

In a step of cutting the outer peripheral surface 13, the operation of cutting the outer peripheral surface 13 with the cutting tool 3 may be performed a plurality of time, but all side surfaces constituting the outer peripheral surface 13 (i.e., the entire peripheral surface 13) is cut in a single operation. For example, in one embodiment of FIG. 3, during the single operation, the cutting tool 3 is moved from the first side surface 13a to the fourth side surface 13d, the second side surface 13b, and the third side surface 13c in this order thereby cutting each side surface. The movement direction of the cutting tool 3 may be a reverse direction.

When cutting the outer peripheral surface 13 with the cutting tool 3, the fixing table 2 holds the opposing surface 12 of the sputtering target 10 onto the fixing table 2 preferably by vacuum suction to fix the sputtering target 10. In the method for machining the sputtering target of the present invention, since the sputtering target 10 is fixed, the fixing table 2 can secure a track of the cutting tool 3 without preventing the movement of the cutting tool 3 when the cutting tool 3 moves along the circumferential direction of the outer peripheral surface 13 of the sputtering target 10.

As applicable conditions for machining, preferably, the rotation speed is set at 100 to 10,000 rpm, and the tool feed speed is set at 100 to 3,000 mm/min.

When the cutting amount per operation is large, the sputtering target is more likely to be distorted due to the machining. On the other hand, when the cutting amount per operation is decreased, the required number of times that the cutting tool 3 orbits the sputtering target increases, which may reduce the productivity of the sputtering target and fail to obtain the satisfactory surface state of the sputtering target after the machining. Accordingly, to suppress the distortion due to the machining and to effectively make the surface state better, the cutting amount per operation is normally 0.1 to 10 mm, preferably 0.3 mm to 7.5 mm, and more preferably 0.5 mm to 5 mm. The number of times that the cutting tool 3 orbits the sputtering target during the machining is normally one to five, preferably one to three, and more preferably one or two.

The outer peripheral surface 13 of the sputtering target 10 is cut with the cutting tool 3 while rotating the cutting tool 3 along the circumferential direction of the outer peripheral surface 13 of the sputtering target 10, which can cut the outer peripheral surface 13 of the sputtering target 10 while releasing heat generated at the outer peripheral surface 13 of the sputtering target 10. Therefore, the distortion that would otherwise occur in the sputtering target due to the heat generated during the machining is reduced, so that the sputtering target 10 with smaller distortion can be achieved.

Figure 5:
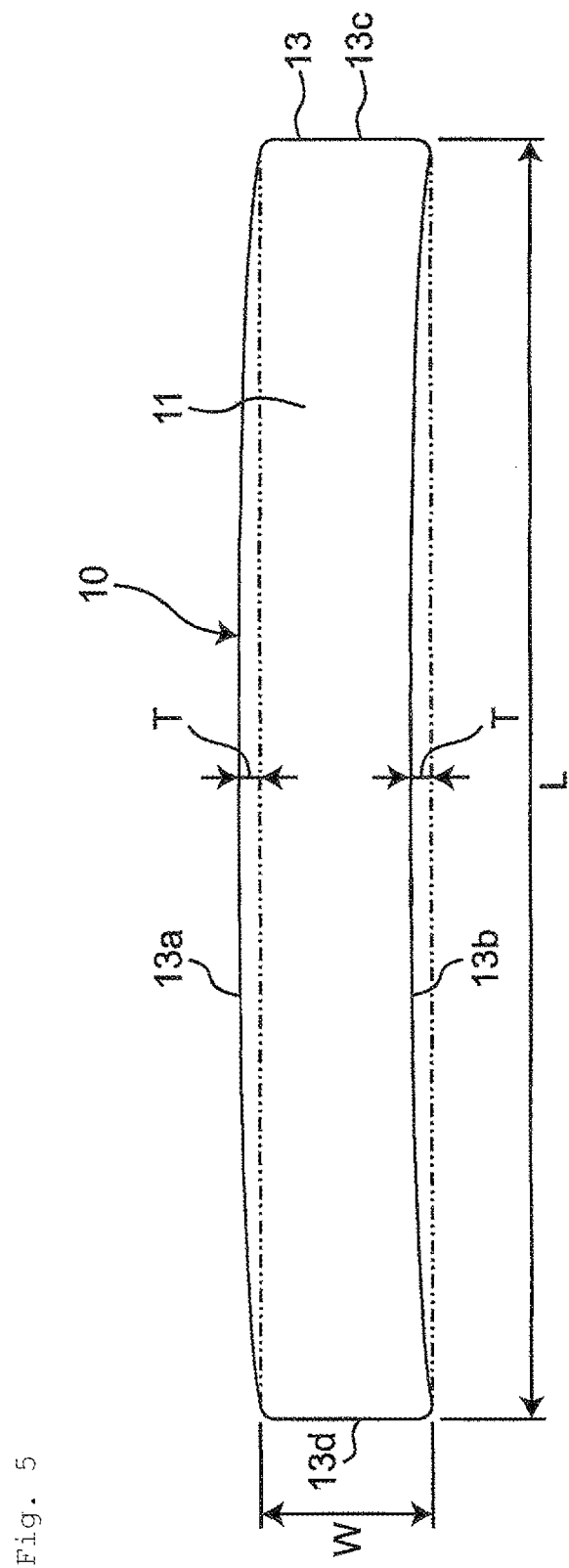
FIG. 5 is a plan view showing a sputtering target obtained after the machining.

FIG. 5 shows a sputtering target 10 obtained after the machining. The outer peripheral surface 13 is substantially rectangular as viewed from the side surface of the sputtering target. The maximum distortion T at each of the first side surface 13a and the second side surface 13b on the long side of the sputtering target 10 is 0.15 mm or smaller. In FIG. 5, the maximum distortion T is exaggerated for the sake of clarity.

As used herein, the term maximum distortion T means the maximum deviation amount from the long side of an imaginary line when the long side of a rectangle with no distortion is expressed by the imaginary line. The method for measuring the maximum distortion T involves measuring a distance between the side surface (i.e., the first side surface 13a and/or the second side surface 13b) on the long side of the sputtering target and a straight line (imaginary line) connecting both ends of the corresponding side surface (i.e., the first side surface 13a and/or the second side surface 13b) on the long side of the sputtering target using the straight line (imaginary line) as the reference, and then recording the maximum measured distance.

For example, in the measurement method for measuring the maximum distortion T, the sputtering target unlocked was mounted on a machining machine such that both ends of the side surface (13a or 13b) on the long side of the sputtering target are put on the straight line (imaginary line) parallel to a scanning axis of the machining machine. Then, the distance between the side surface on the long side and the imaginary line is measured using a measurement instrument, such as a dial gauge, mounted on the machining machine, by linearly moving the machining machine with one end of the side surface on the long side of the sputtering target set as the origin. Thereafter, the maximum measured value is recorded as the maximum distortion T.

In other words, the ratio of the maximum distortion T of the first side surface 13a and/or the second side surface 13b on the long side of the sputtering target 10 to the length L in the long-side direction of the sputtering target 10 can be 0.0075% or smaller. That is, the length L in the long-side direction of the sputtering target 10 is 2,000 mm or larger, and the maximum distortion T of the sputtering target 10 is 0.15 mm or smaller. The width W in the short-side direction of the sputtering target 10 is, for example, 200 mm. In short, when the maximum distortion T is 0.15 mm or smaller, the ratio of the maximum distortion T to the length L in the long-side direction of the sputtering target 10 can be 0.0075% or smaller.

When the maximum distortion T is 0.15 mm or smaller, in other words, when the ratio of the maximum distortion T to the length L in the long-side direction of the sputtering target 10 is 0.0075% or smaller, the high-precision sputtering target 10 can be produced. It is noted that the third and fourth side surfaces 13c and 13d on the short side of the outer peripheral surface 13 are much shorter than the side surfaces on the long side thereof and thus hardly undergo any distortion. In this way, distortion is more likely to occur on the long side, which is much longer than the short side. The length of the long side of the sputtering target 10 is normally in a range of 1.5 m to 4 m. When the ratio of the length of the long side to that of the short side of the sputtering target 10 is in a range of 5:1 to 25:1, distortion is more likely to occur on the long side of the sputtering target.

However, according to the method for producing of the present invention, the occurrence of distortion in the sputtering target can be suppressed effectively.

When the maximum distortion T is 0.15 mm or smaller and the ratio of the maximum distortion T to the length L in the long-side direction of the sputtering target 10 is 0.0075% or smaller, abnormal electrical discharge can be effectively prevented from occurring due to the distortion on the outer peripheral surface of the sputtering target. In addition, the risk of sputtering the surface of a backing plate material due to the distortion of the sputtering target can be suppressed effectively.

Figure 6:
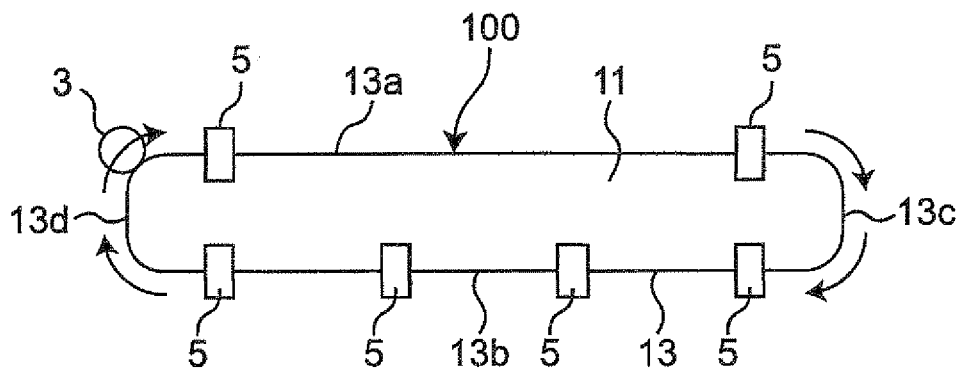
FIG. 6 is a plan view showing Comparative Example of a method for machining a sputtering target.
Figure 7:
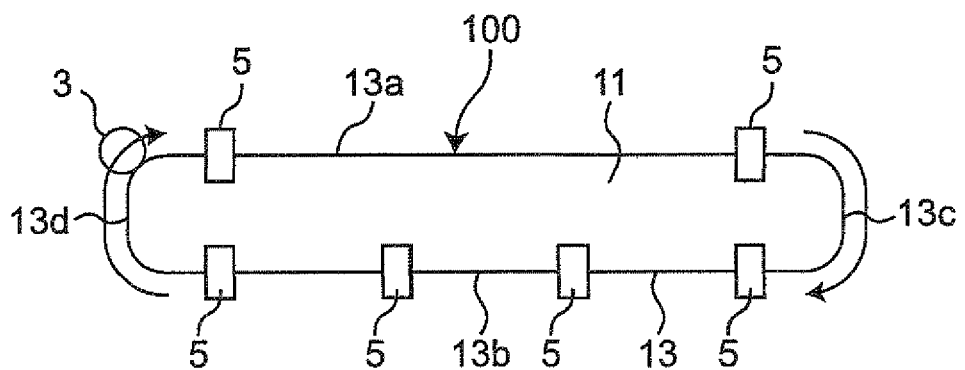
FIG. 7 is a plan view showing Comparative Example of the method for machining a sputtering target.

As Comparative Example, a method for machining the sputtering target using a mechanical chuck fixing will be described. As shown in FIG. 6, the first and second side surfaces 13a and 13b of the outer peripheral surface 13 of the sputtering target 100 are fixed while being pinched by a plurality of chuck portion 5. Subsequently, the cutting tool 3 is moved a plurality of time along the direction indicated by the arrows to cut the corners of the outer peripheral surface 13 with the cutting tool 3. Then, as shown in FIG. 7, the cutting tool 3 is moved a plurality of time in the direction indicated by the arrows, whereby the third and fourth side surfaces 13c and 13d of the outer peripheral surface 13 are cut with the cutting tool 3.

Figure 8:
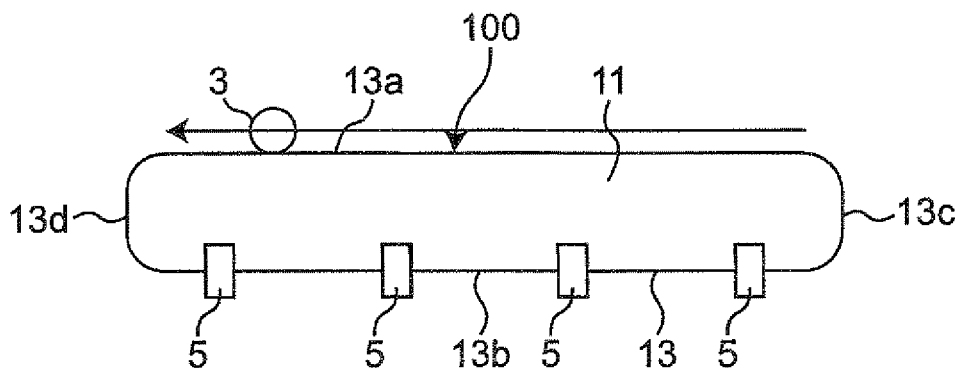
FIG. 8 is a plan view showing Comparative Example of the method for machining a sputtering target.

Thereafter, as shown in FIG. 8, after the chuck portions 5 on the first side surface 13a are removed, the first side surface 13a is cut with the cutting tool 3 with the second side surface 13b fixed by the chuck portions 5. At this time, since being cut by moving the cutting tool 3 a plurality of time along the direction indicated by the arrow, heat generated during the machining is not released from the first side surface 13a, which extends the first side surface 13a.

Figure 9:
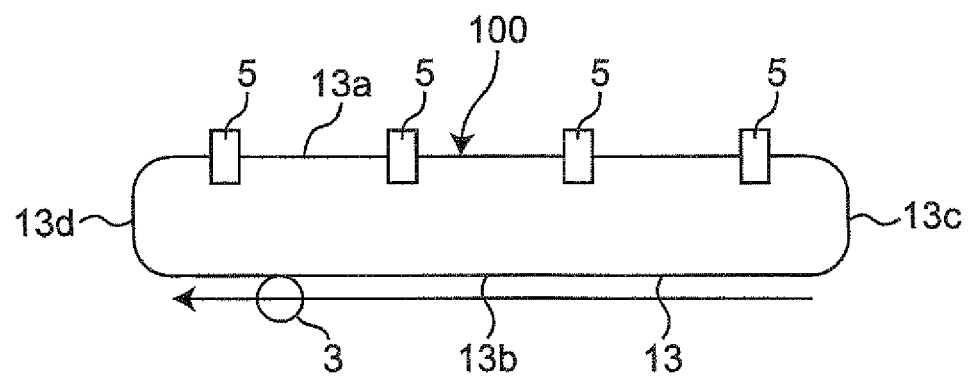
FIG. 9 is a plan view showing Comparative Example of the method for machining a sputtering target.

Furthermore, as shown in FIG. 9, after the chuck portions 5 on the second side surface 13b are removed, the second side surface 13b is cut with the cutting tool 3 with the first side surface 13a fixed by the chuck portions 5. At this time, since being cut by moving the cutting tool 3 a plurality of time along the direction indicated by the arrow, heat generated during the machining is not released from the second side surface 13b, which extends the second side surface 13b.

Therefore, the maximum distortion T of each of the first side surface 13a and the second side surface 13b of the sputtering target 100 obtained after the machining is larger than 0.15 mm, resulting in the low-precision sputtering target 100 with large distortion.

A method for producing a sputtering target product by machining a sputtering target using the method for machining a sputtering target according to the present invention can also fall within the scope of the present invention.

Specifically, in one embodiment of the producing method of the present invention, a target material is formed into a rectangular parallelepiped shape, for example, by melting and/or casting, and then subjected to plastic working, such as rolling, forging, or extruding, to produce a plate-shaped sputtering target. Thereafter, the sputtering target is machined by the above-mentioned method for machining the sputtering target. At this time, the surface of the sputtering target may be finished as necessary. Thereafter, the machined sputtering target is joined to a backing plate, thereby producing a sputtering target product. It is noted that the backing plate may be omitted, and the sputtering target product may be produced using the machined sputtering target only.

The backing plate is made of a conductive material, such as a metal or an alloy thereof. Examples of the metal include copper, aluminum, titanium, and the like. Joining of the sputtering target and the backing plate is performed, for example, by using solder. Examples of the solder material include metals, such as indium, tin, zinc, and lead, and alloys thereof.

The method for producing a sputtering target product includes a step of machining the sputtering target by the above-mentioned method for machining the sputtering target, and thus can obtain the sputtering target product with smaller distortion.

The present invention is not limited to the above-mentioned embodiments, and various modifications and changes can be made to the designs of these embodiments without departing from the scope of the present invention.

In the above-mentioned embodiments, the sputtering target is held onto the fixing table by vacuum suction. The sputtering target may be mechanically held onto the fixing table as long as the movement of the cutting tool along the circumferential direction with respect to the outer peripheral surface of the sputtering target is not obstructed.

In the present embodiment, the fixing table mounts and fixes the opposing surface of the sputtering target, but may mount and fix a sputtering surface of the sputtering target. When the sputtering surface is mounted on the fixing table, the sputtering target is required to be mounted again (to make the sputtering surface face upward) in a finishing step of the sputtering surface. Thus, the opposing surface is preferably mounted and fixed onto the fixing table.

EXAMPLES

Experimental data in Example 1 (FIGS. 3 and 4) and Comparative Example 1 (FIGS. 6 to 9) will be described below. A rolled plate made of high-purity Al having a purity of 99.999% was prepared, and then the rolled plate was attached to a double column type machining center having a controller and a fixing table. In Example 1, the rolled plate was mounted to a mounting surface of the fixing table by a vacuum chuck, whereas in Comparative Example 1, the rolled plate was fixed to the mounting surface of the fixing table by a clamp.

Then, an end mill having a diameter of φ30 mm was attached to the double column type machining center. The controller was used to set the machining conditions, specifically, the rotation speed of the end mill at 500 rpm, the tool feed speed at 250 mm/min, the number of times that the end mill (the cutting tool 3) orbited the sputtering target during one machining operation at two, the amount of cutting in the first orbit at 4 mm, and the amount of cutting in the second orbit at 1 mm. Under the machining conditions, the operation of cutting the outer peripheral surface of the rolled plate was performed to obtain a sputtering target that had a long side of 2,650 mm and a short side of 185 mm. In Comparative Example, an end mill having a diameter of φ30 mm was attached to the double column type machining center. The controller was used to set the machining conditions, specifically, the rotation speed of the end mill at 500 rpm, the tool feed speed at 250 mm/min, the number of times per side of the sputtering target that the end mill (the cutting tool 3) machined one side of the sputtering target during one machining operation at two, the amount of cutting in the first machining at one side at 4 mm, and the amount of cutting in the second machining at the one side at 1 mm. Under the machining conditions, the operation of cutting the outer peripheral surface of the rolled plate was performed to obtain a sputtering target that had a long side of 2,650 mm and a short side of 185 mm.

As a result, in the method for machining the sputtering target of Example 1, the maximum distortion was 0.0065 mm. At this time, the ratio of the maximum distortion was 0.0002% (=(0.0065/2650)×100). In contrast, in the method for machining the sputtering target of Comparative Example 1, the maximum distortion was 0.1755 mm. At this time, the ratio of the maximum distortion was 0.0066% (=(0.1755/2650)×100). In Comparative Example 1, the maximum distortion exceeded 0.15 mm.

In Example 1, the rolled plate was attached to the double column type machining center, and then the outer peripheral surface of the sputtering target was cut with a cutting tool while rotating the cutting tool along the circumferential direction of the outer peripheral surface of the sputtering target. As a result, the heat generated at the outer peripheral surface of the sputtering target could be released, thus making it possible to produce a sputtering target with smaller distortion.

In contrast, in Comparative Example, each of the two long sides of the outer peripheral surface of the sputtering target was cut independently by using a mechanical chuck. Thus, heat generated during the machining was not released, resulting in a sputtering target with large distortion.

Also, on other conditions, Examples of the present invention and Comparative Examples were considered. In Examples of the present invention, the maximum distortion was 0.15 mm or smaller, while in Comparative Examples, the maximum distortion was larger than 0.15 mm.

Specifically, in Example 2, the machining was performed on the same conditions as those in Example 1, thereby obtaining the sputtering target having a long side of 2300 mm and a short side of 200 mm. At this time, the maximum distortion was 0.018 mm, and the ratio of the maximum distortion was 0.0008%. In Example 3, the machining was performed on the same conditions as those in Example 1, thereby obtaining the sputtering target having a long side of 2,500 mm and a short side of 295 mm. At this time, the maximum distortion was 0.009 mm, and the ratio of the maximum distortion was 0.0004%.

Preferable Embodiments

The maximum distortion T is 0.15 mm or smaller, preferably 0.1 mm or smaller, more preferably 0.05 mm or smaller, and still more preferably 0.01 mm or smaller. Thus, a high-precision sputtering target with much smaller distortion can be produced.

The length in the long-side direction of the sputtering target is 1,500 mm or larger and 4,000 mm or smaller, preferably 2,000 mm or larger and 3,500 mm or smaller, more preferably 2,200 mm or larger and 3,200 mm or smaller, and still more preferably 2,500 mm or larger and 2,800 mm or smaller. According to this, the sputtering target with smaller distortion can be produced even though its length in the long-side direction becomes long.

Next, Table 1 shows the ratio of the maximum distortion when the maximum distortion of the sputtering target is 0.15 mm, 0.1 mm, 0.05 mm, or 0.01 mm, and the length in the long-side direction of the sputtering target is 2,000 mm, 2,300 mm, 2,650 mm, 3,000 mm, or 3,500 mm. As can be seen from Table 1, the ratio of the maximum distortion is 0.00029% or larger and 0.0075% or smaller.

TABLE 1

| Maximum distortion | Length of the long side of target | Ratio of the maximum distortion |
| --- | --- | --- |
| 0.15 mm | 2,000 mm | 0.0075% |
|  | 2,300 mm | 0.0065% |
|  | 2,650 mm | 0.0057% |
|  | 3,000 mm | 0.0050% |
|  | 3,500 mm | 0.0043% |
| 0.1 mm | 2,000 mm | 0.0050% |
|  | 2,300 mm | 0.0043% |
|  | 2,650 mm | 0.0038% |
|  | 3,000 mm | 0.0033% |
|  | 3,500 mm | 0.0029% |
| 0.05 mm | 2,000 mm | 0.0025% |
|  | 2,300 mm | 0.0022% |
|  | 2,650 mm | 0.0019% |
|  | 3,000 mm | 0.0017% |
|  | 3,500 mm | 0.0014% |
| 0.01 mm | 2,000 mm | 0.00050% |
|  | 2,300 mm | 0.00044% |
|  | 2,650 mm | 0.00038% |
|  | 3,000 mm | 0.00033% |
|  | 3,500 mm | 0.00029% |

An aspect ratio of the length in the long-side direction of the sputtering target to the length in the short-side direction of the sputtering target is 5 or larger and 25 or smaller, preferably 6 or larger and 20 or smaller, more preferably 7 or larger and 18 or smaller, and still more preferably 8 or larger and 15 or smaller. The aspect ratio is defined as "length in the long-side direction/length in the short-side direction". According to this, the sputtering target with smaller distortion can be produced even though it has an elongated shape.

Table 2 shows Examples 4 to 6 at this time. In respective Examples, each of three samples of the sputtering target was mounted using a vacuum chuck. Then, the outer peripheral surface of each sample of the sputtering target was machined by the end mill while rotating the end mill along the circumferential direction of the outer peripheral surface of the sputtering target on the same conditions as those in Example 1. Finally, the maximum distortion and the ratio of the maximum distortion of each obtained sample of the sputtering target were examined. Examples 4 to 6 describes the maximum distortion and the ratio of the maximum distortion when changing the size and the aspect ratio of the sputtering target. As can be seen from Table 2, although the aspect ratio was 5 or larger and 25 or smaller, the maximum distortion and the ratio of the maximum distortion of the sputtering target could be reduced.

TABLE 2

| Example | Target shape (mm) | Aspect ratio | Maximum distortion (mm) | | Ratio of maximum distortion (%) | |
| --- | --- | --- | --- | --- | --- | --- |
| | | | Average | Standard deviation | Average | Standard deviation |
| 4 | 185 × 26,500 | 14.3 | 0.018 | 0.022 | 0.0007 | 0.0008 |
| 5 | 200 × 2,300 | 11.5 | 0.014 | 0.007 | 0.0006 | 0.0003 |
| 6 | 295 × 2,500 | 8.5 | 0.009 | 0.003 | 0.0004 | 0.0001 |

The lower limit of the maximum distortion is preferably 0.003 mm or larger, and more preferably 0.005 mm or larger. According to this, when the sputtering target and the backing plate are made of different materials and joined together (for example, solder bonded), a sputtering target product obtained after joining would be warped due to heating at the time of the joining because these materials have different linear expansion coefficients. Suppose that the sputtering target is made of Al and the backing plate is made of Cu. Since Al has a higher linear expansion coefficient than Cu, Al extends more than Cu due to heating. However, if Al is slightly distorted, the direction in which Al extends slightly deviates from the linear direction, which leads to a decreased difference from the extension in the linear direction of the backing plate made of Cu. Thus, a difference in the amount of contraction between the sputtering target and the backing plate is less likely to occur during cooling, so that the sputtering target product is hardly warped. When a plurality of sputtering target is arranged after the machining, if the sputtering target is slightly distorted, a contact area between adjacent sputtering targets becomes smaller. Consequently, any scratch that could be generated by contact between the adjacent sputtering targets can be reduced.

DESCRIPTION OF REFERENCE NUMERALS

1 Apparatus for machining a sputtering target
2 Fixing table
3 Cutting tool
4 Controller
5 Chuck part
10 Sputtering target
11 Sputtering surface
12 Opposing surface
13 Outer peripheral surface
13a First side surface
13b Second side surface
13c Third side surface
13d Fourth side surface
20 Mounting surface
21 Intake groove
22 Intake hole
23 Intake passage
24 Seal member
L Length in the long-side direction of a sputtering target
T Maximum distortion
W Width in the short-side direction of the sputtering target

The invention claimed is:

1. A sputtering target comprising a sputtering surface, an opposing surface opposite to the sputtering surface, and an outer peripheral surface being between the sputtering surface and the opposing surface, wherein
the outer peripheral surface is substantially rectangular as viewed from a side surface of the sputtering target, and
a maximum distortion in the perpendicular to the side surface on a long side of the sputtering target is 0.003 mm or larger and 0.15 mm or smaller, wherein
the side surface on a long side of the sputtering target constitutes a part of the outer peripheral surface, and the maximum distortion of the side surface on a long side of the sputtering target means the maximum distance between the side surface on the long side of the sputtering target and a straight line (imaginary line) connecting both ends of the corresponding side surface on the long side of the sputtering target,
the ratio of the length of the long side to the length of a short side of the sputtering target being in the range of 5:1 to 25:1, and
the material of the sputtering target being aluminum the purity of which is 99.99% or larger.

2. The sputtering target according to claim 1, wherein a ratio of the maximum distortion of the side surface on the long side of the sputtering target to a length in a long-side direction of the sputtering target is 0.0075% or smaller.

3. The sputtering target according to claim 1, wherein a length in a long-side direction of the sputtering target is 1,500 mm or larger and 4,000 mm or smaller.

4. The sputtering target according to claim 1, wherein an aspect ratio of a length in a long-side direction to a length in a short-side direction of the sputtering target is 5 or larger and 25 or smaller.

5. A sputtering target product, which comprises the sputtering target according to claim 1, and a backing plate to which the sputtering target is joined.

* * * * *